United States Patent [19]

May

[11] Patent Number: 5,426,384
[45] Date of Patent: Jun. 20, 1995

[54] VOLTAGE CONTROLLED OSCILLATOR (VCO) WITH SYMMETRICAL OUTPUT AND LOGIC GATE FOR USE IN SAME

[75] Inventor: Michael R. May, Austin, Tex.

[73] Assignee: Motorola, Inc., Schaumburg, Ill.

[21] Appl. No.: 172,973

[22] Filed: Dec. 27, 1993

[51] Int. Cl.⁶ .............. H03K 19/0948; H03K 3/0231; G01R 19/175
[52] U.S. Cl. .................................. 327/52; 326/121; 327/57; 331/34; 331/111; 331/143; 331/177 R; 331/DIG. 3
[58] Field of Search ............ 331/34, 111, 143, 177 R, 331/DIG. 3; 307/451, 445, 446, 448, 454, 350, 530, 355; 326/104, 112, 121; 327/50, 52, 55, 57

[56] References Cited

U.S. PATENT DOCUMENTS

| | | | |
|---|---|---|---|
| 4,839,537 | 6/1989 | Ueno | 307/446 |
| 5,075,581 | 12/1991 | Kamata | 307/475 |
| 5,194,831 | 3/1993 | Jackson | 331/111 |

OTHER PUBLICATIONS

Banu; "MOS Oscillators with Multi-Decade Tuning Range and Gigaherz Maximum Speed;" IEEE Journal of Solid-State Circuits, vol. 23, no. 6, pp. 1386-1393, Dec. 1988.

*Primary Examiner*—Siegfried H. Grimm
*Attorney, Agent, or Firm*—Paul J. Polansky

[57] ABSTRACT

A voltage controlled oscillator (VCO) (23) includes a periodic signal generator (30) such as a comparator (42)followed by a latch (43), and a logic gate such as a NAND gate (31) connected to the output of the latch (43) to adjust for asymmetries in the output signals from the latch (43). In one embodiment, the NAND gate (31) includes two pullup transistors (80, 81) receiving first and second output signals from the latch and connected between a first power supply voltage terminal and an output node (86). Two switching branches (82, 83 and 84, 85) each including two transistors are connected between the output node (86) and a second power supply voltage terminal. The order of the input signals received by the two transistors is reversed between the two switching branches (82, 83 and 84, 85) to compensate for any duty cycle asymmetries. A frequency divider (32) divides the output of the NAND gate (31) to complete the duty cycle adjustment.

12 Claims, 3 Drawing Sheets

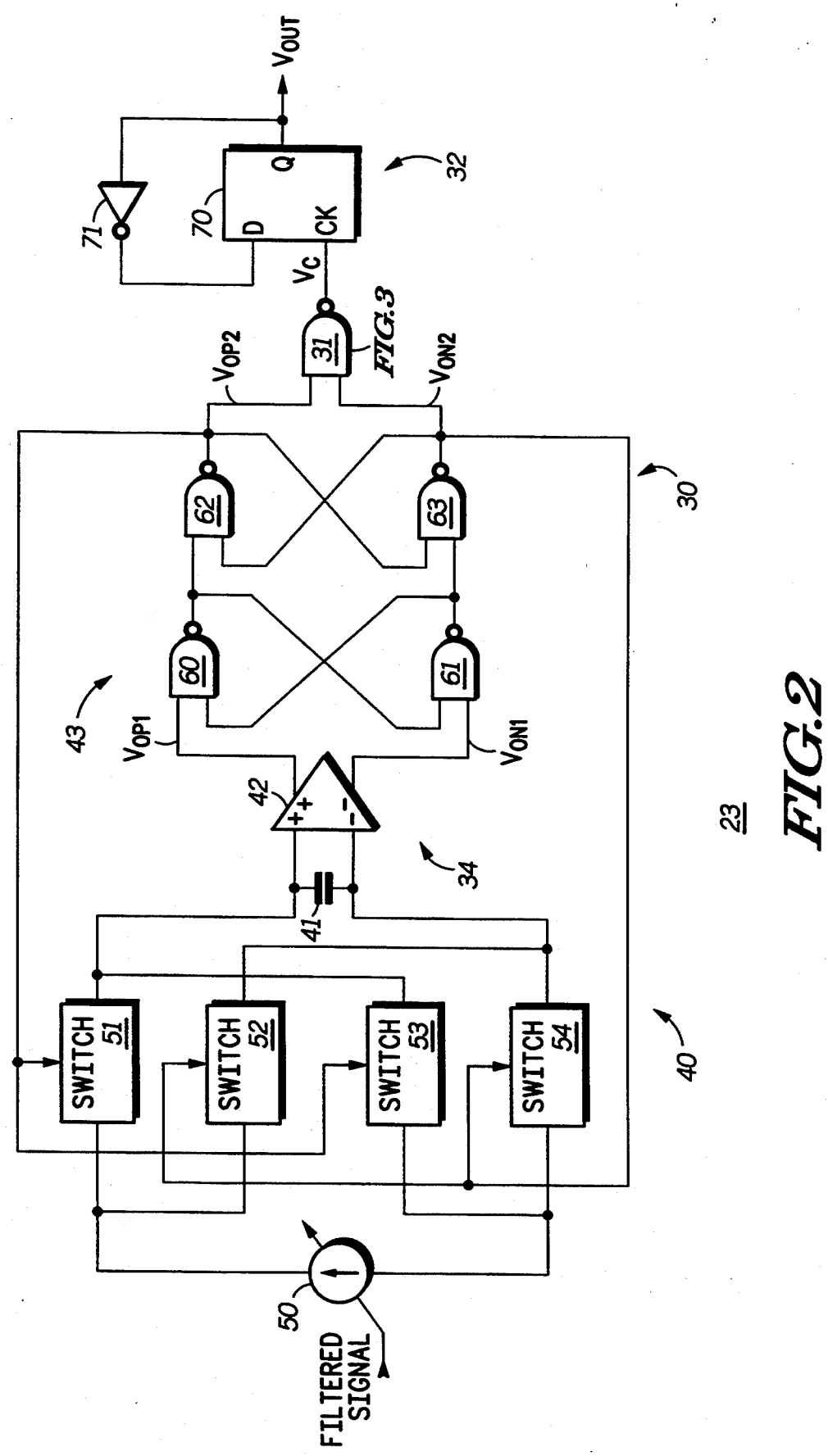

VOLTAGE CONTROLLED OSCILLATOR (VCO) WITH SYMMETRICAL OUTPUT AND LOGIC GATE FOR USE IN SAME

FIELD OF THE INVENTION

This invention relates generally to electrical circuits, and more particularly, to voltage controlled oscillators (VCOs) and circuits for use in VCOs.

BACKGROUND OF THE INVENTION

Digital logic circuits are of two basic types, combinational and sequential. Combinational logic circuits generate an output signal asynchronously in response to at least one input signal. That is, they provide the output signal as soon as the input signals propagate through the circuit. Sequential logic circuits, on the other hand, require clocking or timing information in order to perform logic functions. While combinational logic circuits are important building blocks in integrated circuit design, almost all digital integrated circuits use at least some sequential logic circuits. In addition, some analog integrated circuits, such as those having switched capacitor filters, also require clocking information.

With increasing speeds of integrated circuits, there arises the need to have more and more precise clocking signals. Normally these integrated circuits receive a digital clock input signal, and then buffer the clock input signal before providing it to internal circuits. During one part of the clock period, the clock signal is at a logic high voltage, and during another part of the clock period, the clock signal is at a logic low voltage. The rest of the clock period is made up of transitional states between a logic high and a logic low voltage.

In most applications, it is desirable for these integrated circuits to receive a clock which has 50/50 duty cycle, i.e., has its logic high time equal to its logic low time in each clock period. However, as integrated circuits become faster and faster, signal propagation delay through logic gates in the clock buffers becomes a greater percentage of the clock period. This can cause the duty cycle to change from 50/50 if the logic circuit which generates the clock signal has a bias toward one logic state.

A significant source of this duty cycle error originates from conversion from analog (continuous) waveforms to digital signals of either 1 or 0 value inside the clock generator circuit. The analog-to-digital conversion is frequently performed with a comparator followed by cross-coupled NAND gates. The comparator amplifies the small amplitude analog signal into nearly digital values. The cross-coupled NAND gates complete the conversion to fully digital signals. This method of obtaining digital values is satisfactory, but the cross-coupled NAND gates introduce a systematic duty cycle error. This error is created because the network of cross-coupled gates has rise and fall times that are an unequal number of gate delays. This fact introduces a duty cycle error of one gate delay that is equal to the difference in number of gate delays for rising and falling signals. This gate delay asymmetry becomes a significant fraction of the clock period as frequencies increase and lower supply voltages increase gate delay times.

SUMMARY OF THE INVENTION

Accordingly, the present invention provides, in one form, a logic gate including first, second, third, and fourth switching elements. The first switching element has a first terminal coupled to a first power supply voltage terminal, a second terminal coupled to an output node providing an output signal of the logic gate thereon, and a control terminal for receiving a first input signal. The second switching element has a first terminal coupled to the first power supply voltage terminal, a second terminal coupled to the output node, and a control terminal for receiving a second input signal. The third switching element has a first terminal coupled to the output node, a second terminal coupled to a second power supply voltage terminal, and first and second control terminals respectively receiving the first and second input signals. The third switching element includes first and second switching subelements serially coupled between the output node and the second power supply voltage terminal respectively responsive to the first and second input signals. The fourth switching element has a first terminal coupled to the output node, a second terminal coupled to the second power supply voltage terminal, and first and second control terminals respectively receiving the second and first input signals. The fourth switching element includes third and fourth switching subelements serially coupled between the output node and the second power supply voltage terminal respectively responsive to the second and first input signals.

In another form, the present invention provides a voltage controlled oscillator (VCO) with a symmetrical output including a periodic signal generator and a logic gate. The periodic signal generator has an input terminal for receiving an input voltage, and first and second output terminals for respectively providing a first signal and a second signal of a periodic differential output signal. The logic gate has first and second input terminals respectively coupled to the first and second output terminals of the periodic signal generator, and an output terminal coupled to an output node. The logic gate includes first, second, third, and fourth switching elements. The first switching element has a first terminal coupled to a first power supply voltage terminal, a second terminal coupled to an output node providing an output signal of the VCO thereon, and a control terminal for receiving the first signal. The second switching element has a first terminal coupled to the first power supply voltage terminal, a second terminal coupled to the output node, and a control terminal for receiving the second signal. The third switching element has a first terminal coupled to the output node, a second terminal coupled to a second power supply voltage terminal, and first and second control terminals respectively receiving the first and second signals. The third switching element includes first and second switching subelements serially coupled between the output node and the second power supply voltage terminal respectively responsive to the first and second signals. The fourth switching element has a first terminal coupled to the output node, a second terminal coupled to the second power supply voltage terminal, and first and second control terminals respectively receiving the second and first signals. The fourth switching element includes third and fourth switching subelements serially coupled between the output node and the second power supply voltage terminal respectively responsive to the second and first signals.

In still another form, the present invention provides a differential input to single-ended output comparator with a symmetrical output, including an input comparator, a differential latch, and a logic gate. The input comparator has first and second input terminals for respectively receiving first and second input signals of a periodic differential input signal, and positive and negative output terminals. The differential latch has first and second input terminals respectively coupled to the positive and negative output terminals of the comparator, and first and second output terminals for respectively providing first and second signals. The logic gate has a first input terminal coupled to the first output terminal of the differential latch, a second input terminal coupled to the second output terminal of the differential latch, and an output terminal for providing an output signal of the comparator.

These and other features and advantages will be more clearly understood from the following detailed description taken in conjunction with the accompanying drawings.

BRIEF DESCRIPTION OF THE DRAWINGS

FIG. 2 illustrates in partial block diagram, partial logic diagram, and partial schematic diagram form the VCO of FIG. 2.

DETAILED DESCRIPTION OF A PREFERRED EMBODIMENT

Figure 1:
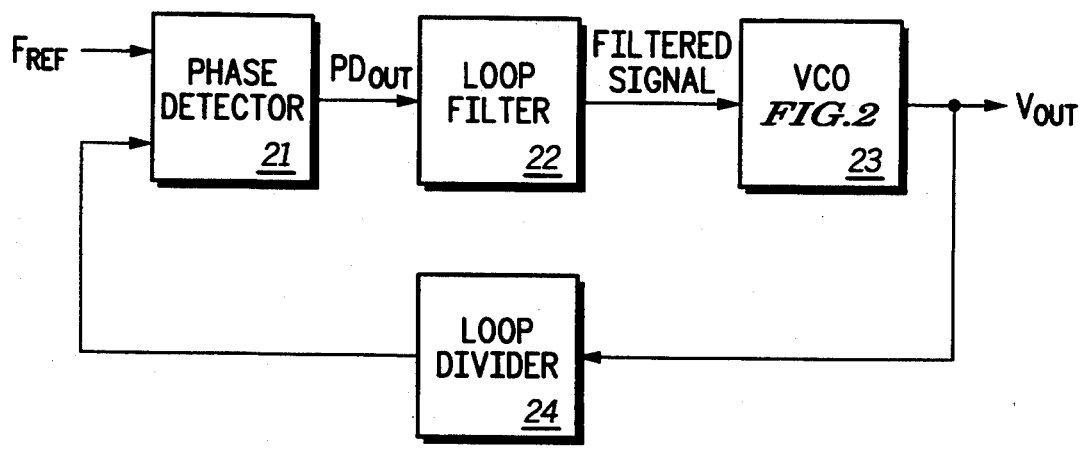
FIG. 1 illustrates in block diagram form a phase locked loop (PLL) having a voltage controlled oscillator (VCO) according to the present invention.

FIG. 1 illustrates in block diagram form a phase locked loop (PLL) 20 having a voltage controlled oscillator (VCO) 23 according to the present invention. PLL 20 also includes a phase detector 21, a loop filter 22, VCO 23, and a loop divider 24. Phase detector 21 has a first input terminal for receiving a reference signal labelled "$F_{REF}$", a second input terminal, and an output terminal for providing a signal labelled "$PD_{OUT}$". $F_{REF}$ is a clock signal having a known reference frequency, and is normally generated by a crystal oscillator (not shown). Loop filter 22 has an input terminal for receiving signal $PD_{OUT}$, and an output terminal for providing a signal labelled "FILTERED SIGNAL". VCO 23 has an input terminal for receiving the FILTERED SIGNAL, and an output terminal for providing a signal labelled "$V_{OUT}$". Loop divider 24 has an input terminal for receiving signal $V_{OUT}$, and an output terminal connected to the second input terminal of phase detector 21.

As a unit, PLL 20 functions so that the frequency of the output signal, $V_{OUT}$, is N times the frequency of signal $F_{REF}$, where N is defined as the loop divider ratio. Analyzing the building blocks of the PLL illustrates this performance more clearly. Phase detector 21 senses the phase difference in $F_{REF}$ and the divided down $V_{OUT}$ signal. Phase detector 21 provides signal $PD_{OUT}$ which causes VCO 23 to speed up, slow down, or stay at the same frequency. Loop filter 22 acts to condition signal $PD_{OUT}$, and to increase the noise immunity of PLL 20. Without loop filter 22, PLL 20 responds too quickly to spurious signals and the result is large deviations in output frequency. VCO 23 is a circuit that takes the FILTERED SIGNAL as an input and produces a digital periodic waveform whose frequency is roughly proportional to the FILTERED SIGNAL. Loop divider 24 is a digital logic block that reduces the frequency of the digital $V_{OUT}$ waveform by a known constant. All of these blocks work together to reach a steady state where the time average of the output of phase detector 21 is zero, and therefore VCO 23 is generating the desired constant frequency that is N times the reference frequency.

Many variations are possible for each block in PLL 20 which was briefly described above. First, phase detector 21 can be built of either analog or digital components, although digital phase detectors are more popular today. Further, digital phase detectors can be designed to be sensitive to both phase and frequency differences, so that VCO 23 can be correctly controlled over its entire range of operation. Digital phase detectors are also usually followed by a charge pump to convert from digital to analog waveforms, so that the signal can easily be conditioned by the loop filter. In this case, phase detector 21 encompasses both of these functions. Second, loop filter 22 can be made of either passive components (resistors and capacitors) or a combination of passive and active components (transistors). The choice of an appropriate loop filter depends on the application of the PLL. Third, VCO 23 can be designed in many architectures. Popular approaches include ring oscillators and relaxation oscillators. Ring oscillators are built as a closed loop of an odd number of inverters whose speed of oscillation is determined by the available current in each inverter. Relaxation oscillators depend on non-linear, often digital circuits to control the oscillation of an analog subcircuit. Lastly, loop divider 24 is a usually digital circuit that divides the output of VCO 23 by a specified frequency ratio. This divider ratio can be fixed or variable, depending on the application.

The duty cycle of the output signal from PLL 20 is critical to the performance of the circuit that uses $V_{OUT}$ as a clock signal. The clocked circuit (not shown in FIG. 1) is designed to perform a required amount of work during each half cycle of the clock. If this half cycle is too short, then the work may not be completed; if it is too long, time is wasted since all operations are complete well before the end of the clock half period. A major source of these duty cycle errors can be corrected by using PLL 20 which includes VCO 23. This example uses an additional NAND gate and a frequency divider to correct the duty cycle errors caused by a comparator's output, as discussed previously. This duty cycle error originates from the difference in number of gate delays that it takes a rising or falling signal to propagate through cross-coupled gates forming a latch at the output of the comparator. This asymmetry causes a duty cycle deviation from 50% by the amount of the extra gate delay.

FIG. 2 illustrates in partial block diagram, partial logic diagram, and partial schematic diagram form VCO 23 of FIG. 2. VCO 23 includes generally a periodic signal generator 30, a NAND gate 31, and a frequency divider 32. Periodic signal generator 30 includes a generally differential voltage-controlled current source 40, a capacitor 41, a comparator 42, and a latch 43.

Differential voltage-controlled current source 40 includes a voltage-controlled current source 50, and switches 51–54. Voltage-controlled current source 50 has first and second terminals, and a control terminal for receiving the FILTERED SIGNAL. Switch 51 has a first terminal connected to the first terminal of voltage-controlled current source 50, a second terminal, and a control terminal. Switch 52 has a first terminal connected to the first terminal of voltage-controlled current source 50, a second terminal, and a control terminal. Switch 53 has a first terminal connected to the second terminal of voltage-controlled current source 50, a second terminal connected to the second terminal of switch 51, and a control terminal. Switch 54 has a first terminal connected to the second terminal of voltage-controlled current source 50, a second terminal connected to the second terminal of switch 52, and a control terminal. Switches 51–54 may be any conventional switching elements, but are preferably implemented with transmission gates when VCO 23 is implemented in complementary metal-oxide-semiconductor (CMOS) technology.

Capacitor 41 has a first terminal connected to the second terminals of switches 51 and 53, and a second terminal connected to the second terminals of switches 52 and 54. Comparator 42 has a positive input terminal connected to the second terminals of switches 51 and 53, a negative input terminal connected to the second terminals of switches 52 and 54, a positive output terminal, and a negative output terminal.

Latch 43 includes NAND gates 60–63. NAND gate 60 has a first input terminal connected to the positive output terminal of comparator 42, a second input terminal, and an output terminal. NAND gate 61 has a first input terminal connected to the negative output terminal of comparator 42, a second input terminal connected to the output terminal of NAND gate 60, and an output terminal connected to the second input terminal of NAND gate 60. NAND gate 62 has a first input terminal connected to the output terminal of gate 60, a second input terminal, and an output terminal connected to the control terminals of switches 51 and 53 and providing a signal labelled "$V_{OP2}$". NAND gate 63 has a first input terminal connected to the output terminal of NAND gate 61, a second input terminal connected to the output terminal of NAND gate 62, and an output terminal connected to the second input terminal of NAND gate 62 and to the control terminals of switches 52 and 54 and providing a signal labelled "$V_{ON2}$".

NAND gate 31 has a first input terminal connected to the output terminal of NAND gate 62, a second input terminal connected to the output terminal of NAND gate 63, and an output terminal for providing a signal labelled "$V_C$". Frequency divider 32 includes a D-type flip flop 70, and an inverter 71. Flip-flop 70 has a data input terminal labelled "D", a clock input terminal labelled "CK" for receiving signal $V_C$, and a true output terminal labelled "Q" for providing signal $V_{OUT}$. Inverter 71 has an input terminal connected to the Q output terminal of flip-flop 70, and an output terminal connected to the D input terminal of flip-flop 70.

VCO 23 uses a voltage-controlled current source 50 with digitally controlled polarity to charge and discharge parasitic capacitance which is modeled as capacitor 41 at the input to comparator 42. Switches 51–54 steer the current so that the differential voltage at the input to comparator 42 alternates as comparator 42 switches and the digital feedback reverses direction of the current. The result is a differential, periodic, small amplitude waveform at the input of comparator 42. The frequency of oscillation is roughly proportional to the value of the current source, which is controlled by the voltage input to VCO 23. Thus, a larger voltage at the input to VCO 23 increases the current, which charges the parasitic capacitor faster, and the speed of the VCO increases.

More specifically, the control input terminals of switches 51 and 52 are true, i.e., switches 51 and 52 close when the control inputs are at a logic high. On the other hand, the control input terminals of switches 53 and 54 are complementary, i.e., switches 53 and 54 close when the inputs are at a logic low. Thus, when signal $V_{OP2}$ is at a logic high and signal $V_{ON2}$ is at a logic low, switches 51 and 54 close and current source 50 provides current into the first terminal of capacitor 41. When signal $V_{OP2}$ is at a logic low and signal $V_{ON2}$ is at a logic high, switches 52 and 53 close and current source 50 provides current into the second terminal of capacitor 41. Additionally, the outputs of switch pairs 51 and 53, and 52 and 54, are each connected through series diodes with parallel shunting switches (not shown in FIG. 2). When signal $V_{ON2}$ is at a logic high, a first shunting switch bypasses a first diode connected between the second terminal of switch 53 and the first terminal of capacitor 41, and a second diode is connected in series between the second terminal of switch 52 from the second terminal of capacitor 41. Likewise, when signal $V_{OP2}$ is at a logic high, a second shunting switch bypasses the second diode connected between the second terminal of switch 54 and the second terminal of capacitor 41, and the first diode is connected in series between the second terminal of switch 52 from the second terminal of capacitor 41. The result of alternately forward biasing and then bypassing these diodes is to create a non-linear voltage drop across capacitor 41 which must be equalized before the output of comparator 42 changes state.

Latch 43 at the output of comparator 42 includes two sets of cross-coupled NAND gates. Latch 43 takes the nearly-digital output of comparator 42 and produces fully-digital output signals. The configuration of these gates guarantees that VCO 23 will not stabilize in an undesired state where no oscillation occurs. The two outputs of the cross-coupled gates are both at a logic high momentarily because one output transitions to a logic high before the other one can transition to a logic low. NAND gate 31 takes the output of latch 43 and produces a logic low in this transient time when both $V_{OP2}$ and $V_{ON2}$ are at a logic high. Frequency divider 32 halves the frequency output of NAND gate 31 to recover the original frequency that is found at the input to comparator 42.

Without NAND gate 31 and frequency divider 32, the output of VCO would be provided as either $V_{OP2}$ or $V_{ON2}$. The gate delay asymmetry at the output of latch 43 corrupts the duty cycle of the output of VCO 23. As described earlier, latch 43 does not provide a 50% duty cycle output, due to the fact that one output cannot fall until the other one has transitioned high. This asymmetry is equal to one gate delay and is eliminated by NAND gate 31 and frequency divider 32, to create a nearly 50% duty cycle.

The differential architecture that is found in VCO 23 is advantageous for several reasons. First, differential circuits have manufacturing process insensitivity that makes circuit performance dependent on matching between the devices instead of the absolute performance of the devices. This process insensitivity increases the ability to control duty cycle behavior at the output of VCO 23. The other major advantage of differential circuits is the fact that noise is seen as a common-mode component and will be attenuated by the differential architecture. Thus, the differential approach shown in VCO 23 makes the output signal insensitive to noise and process variations.

This differential approach is continued in NAND gate 31, which receives the outputs of latch 43. NAND gate 31 also has symmetry about its halves and will therefore preserve the symmetry of VCO 23 through the single-ended conversion process. Thus, VCO 23 provides an output signal with a duty cycle that is insensitive to manufacturing process variations and noise. The differential to single-ended conversion is completed in a fully-symmetric architecture. Frequency divider 32, which divides down the output of NAND gate 31, introduces only slight errors in the duty cycle because frequency divider 32 can be made very fast and minimize transition time. Thus, random mismatches in device strengths in frequency divider 32 will not significantly contribute to duty cycle mismatch. Thus, the differential architecture, symmetric differential to single ended conversion, and fast frequency divider all contribute to minimizing duty cycle errors.

Figure 3:
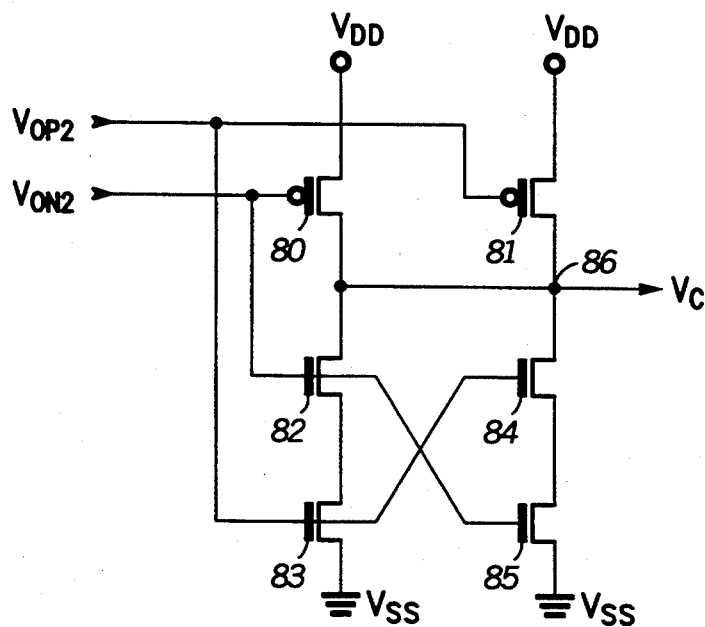
FIG. 3 illustrates in schematic form the NAND gate of FIG. 2.

FIG. 3 illustrates in schematic form NAND gate 31 of FIG. 2. NAND gate 31 includes P-channel metal-oxide-semiconductor (MOS) transistors 80 and 81, and N-channel MOS transistors 82–85. Transistor 80 has a source connected to a power supply voltage terminal labelled "$V_{DD}$", a gate for receiving signal $V_{ON2}$, and a drain connected to an output node 86. $V_{DD}$ is a more-positive power supply voltage terminal providing a nominal voltage of about 3 volts. Transistor 81 has a source connected to $V_{DD}$, a gate for receiving signal $V_{OP2}$, and a drain connected to output node 86. Transistor 82 has a drain connected to node 86, a gate for receiving signal $V_{ON2}$, and a source. Transistor 83 has a drain connected to the source of transistor 82, a gate for receiving signal $V_{OP2}$, and a source connected to a power supply voltage terminal labelled "$V_{SS}$". $V_{SS}$ is a more-negative or ground power supply voltage terminal providing a nominal voltage of about zero volts. Transistor 84 has a drain connected to node 86, a gate for receiving signal $V_{OP2}$, and a source. Transistor 85 has a drain connected to the source of transistor 84, a gate for receiving signal $V_{ON2}$, and a source connected to $V_{SS}$.

NAND gate 31 performs a logical NAND function. NAND gate 31 also has identical propagation delay for each input due to the two pulldown stacks that contain either a "slow" or "fast" switching device for each input. Specifically, transistor 80 performs the pullup for one input, and transistor 81 performs the pullup for the other input. These devices are of equal size and respond identically to their respective inputs. Transistors 82 and 83 form the first pulldown element, with transistor 82 being the faster pulldown and transistor 83 being the slower pulldown. Transistors 84 and 85 form the second pulldown element with transistor 84 being the fast pulldown and transistor 85 being the slower pulldown. The pulldown stacks, when acting as a unit, respond equally to either input because each input has a slow and fast switching element in separate stacks. Note that while the illustrated embodiment of NAND gate 31 uses CMOS transistors, this behavior is independent of transistor types and would apply to any transistor family that can be used for digital logic design.

NAND gate 31 demonstrates significant performance advantage over a NAND gate with a single pulldown stack. A single pulldown stack NAND gate has a slow and fast input due to the different amount of capacitance that each switching element must discharge. The switching element that is connected to $V_{SS}$ has to discharge more capacitance than the switching element in the pulldown stack that is not connected to $V_{SS}$. This difference in capacitance creates a difference in propagation delays through the logic gate and will contribute directly to duty cycle errors in the output of the VCO. The dual pulldown stacks eliminate this source of error and create a differential to single-ended converter that has identical behavior for both of its inputs.

In another embodiment, the symmetrical structure of NAND gate 31 could be used to form a NOR gate which could then be substituted for NAND gate 31 in VCO 23 of FIG. 2. Such a NOR gate is formed by connecting the nodes previously connected to $V_{DD}$ to $V_{SS}$, connecting the nodes previously connected to $V_{SS}$ to $V_{DD}$, and reversing the conductivities of the transistors. That is, transistors 80 and 81 would become N-channel transistors, and transistors 82–85 would become P-channel transistors. Appropriate modification of frequency divider 32 and substitution of NOR gates for NAND gates 60–63 would also be required if this NOR gate were used in VCO 23.

Figure 4:
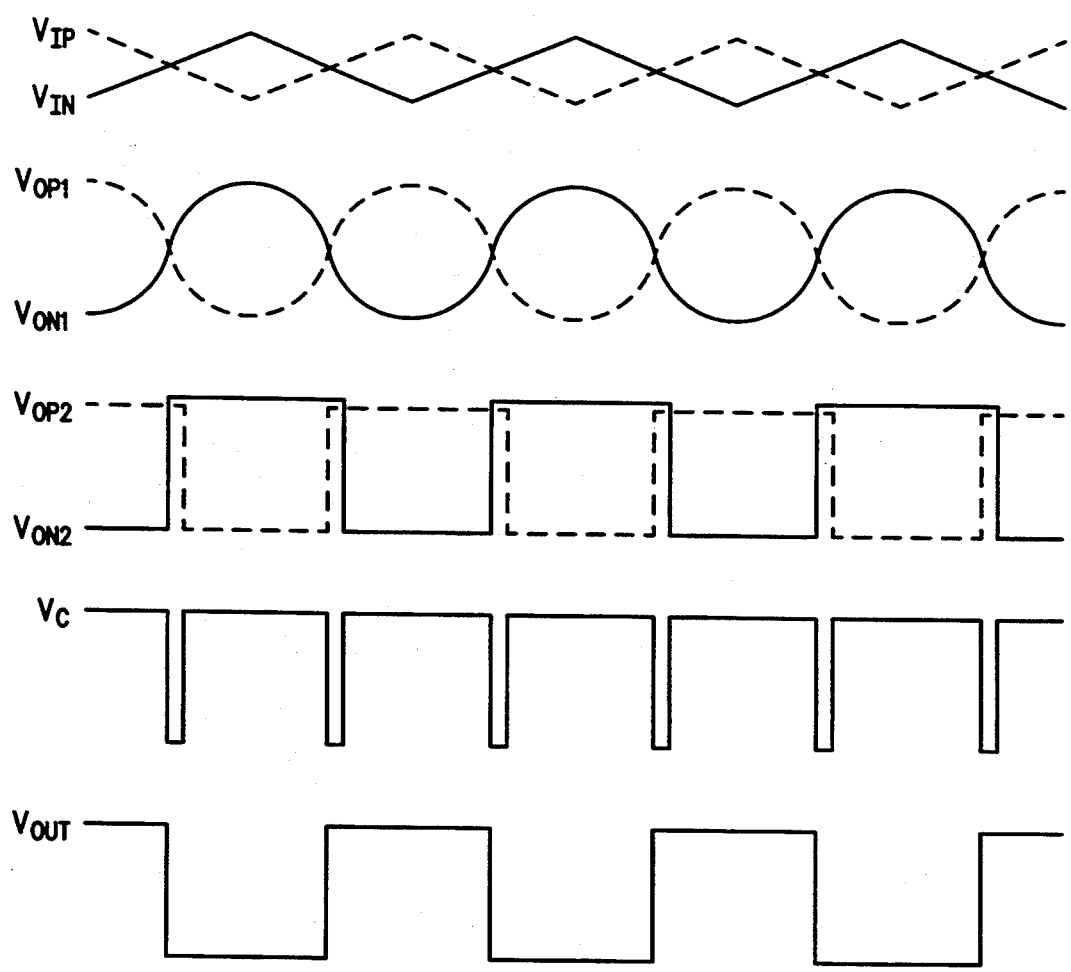
FIG. 4 illustrates a timing diagram of signals pertinent to FIG. 2.

FIG. 4 illustrates a timing diagram of signals pertinent to FIG. 2. The horizontal axis corresponds to time, and the vertical axis to voltage, although not necessarily to scale. Different signals of interest, including $V_{IP}$, $V_{IN}$, $V_{OP1}$, $V_{ON1}$, $V_{OP2}$, $V_{ON2}$, $V_C$, and $V_{OUT}$ are represented in sequence along the vertical axis. FIG. 4 illustrates the small-signal input to the comparator, signals $V_{IP}$ and $V_{IN}$, and the amplified outputs, signals $V_{OP1}$ and $V_{ON1}$, that are nearly digital values. Signals $V_{OP2}$ and $V_{ON2}$ at the output of latch 43 of FIG. 2 exhibit the overlap that is introducing the duty cycle error. Signal $V_C$ at the output of NAND gate 31 transitions to a logic low during the time that signals $V_{OP2}$ and $V_{ON2}$ overlap. Frequency divider 32 reduces the frequency of signal $V_C$ to recover the original frequency at the input to comparator 42.

Analyzing FIG. 4 closely shows that the time from when signal $V_{IN}$ exceeds signal $V_{IP}$ to the time that signal $V_{ON2}$ switches to a logic high, is equal to the time from when signal $V_{IP}$ exceeds signal $V_{IN}$ to the time that $V_{OP2}$ switches to a logic high. In other words, the time for a rising signal to propagate through comparator 42 and latch 43 is equal for either comparator input. The duty cycle error originates from the mismatch in rising and falling signal delays through each of these paths. The rising delays are equal and the falling delays are equal, but the propagation delay for a rising signal is not equal to the propagation delay for a falling signal. The output of NAND gate 31 becomes a logic low in response to the second output of latch 43 becoming a logic high. NAND gate 31 thus reacts to rising edges to create the active low pulse that frequency divider 32 divides down. The critical timing edges at the output of latch 43 are only the rising edges and these are exactly time-shifted by one half of the clock period. Thus, with differential symmetry, the duty cycle that is generated from the rising edges of both signals is nearly 50%.

While the invention has been described in the context of a preferred embodiment, it will be apparent to those skilled in the art that the present invention may be modified in numerous ways and may assume many embodiments other than that specifically set out and described above. Several modifications are obvious. For example, the logic circuit is disclosed in the context of a NAND gate but becomes a NOR gate when the power supplies and transistor conductivities are reversed. Thus, NAND gate 31 could be replaced with a corresponding NOR gate, with NOR gates used in latch 43, and VCO 23 would still have the same basic performance. Also, VCO 23 can be designed in any number of ways that include a ring oscillator or other type of relaxation oscillator. Also, alternate transistor families can be used to implement the functions besides MOS. Accordingly, it is intended by the appended claims to cover all modifications of the invention which fall within the true spirit and scope of the invention.

I claim:

1. A voltage controlled oscillator (VCO) with a symmetrical output comprising:
 a periodic signal generator having an input terminal for receiving an input voltage, and first and second output terminals for respectively providing a first signal and a second signal of a periodic differential output signal; and
 a logic gate having first and second input terminals respectively coupled to said first and second output terminals of said periodic signal generator, and an output terminal coupled to an output node, comprising:
  a first switching element having a first terminal coupled to a first power supply voltage terminal, a second terminal coupled to an output node providing an output signal of the VCO thereon, and a control terminal for receiving said first signal;
  a second switching element having a first terminal coupled to said first power supply voltage terminal, a second terminal coupled to said output node, and a control terminal for receiving said second signal;
  a third switching element having a first terminal coupled to said output node, a second terminal coupled to a second power supply voltage terminal, and first and second control terminals respectively receiving said first and second signals, said third switching element including first and second switching subelements serially coupled between said output node and said second power supply voltage terminal respectively responsive to said first and second signals; and
  a fourth switching element having a first terminal coupled to said output node, a second terminal coupled to said second power supply voltage terminal, and first and second control terminals respectively receiving said second and first signals, said fourth switching element including third and fourth switching subelements serially coupled between said output node and said second power supply voltage terminal respectively responsive to said second and first signals.

2. The VCO of claim 1 wherein said first, second, third, and fourth switching subelements comprise first, second, third, and fourth metal-oxide-semiconductor (MOS) transistors, respectively.

3. The VCO of claim 2 wherein said first, second, third, and fourth MOS transistors are characterized as being N-channel MOS transistors.

4. The VCO of claim 1 wherein said first and second switching elements comprise first and second metal-oxide-semiconductor (MOS) transistors, respectively.

5. The VCO of claim 4 wherein said first and second MOS transistors are characterized as being P-channel MOS transistors.

6. The VCO of claim 1 further comprising a frequency divider having an input terminal coupled to said output node, and an output terminal for providing a second output signal of the VCO.

7. The VCO of claim 6 wherein said frequency divider comprises:
 a D type flip-flop having a clock input terminal coupled to said output node of said logic gate, a D input terminal, and a Q output terminal for providing said second output signal of the VCO; and
 an inverter having an input terminal coupled to said Q output terminal of said D type flip-flop, and an output terminal coupled to said D input terminal of said D type flip-flop.

8. The VCO of claim 1 wherein said periodic signal generator comprises:
 a differential voltage-controlled current source having an input terminal for receiving said input voltage, a first output terminal, and a second output terminal;
 a capacitor having a first terminal coupled to said first output terminal of said differential voltage-controlled current source, and a second terminal coupled to said second output terminal of said differential voltage-controlled current source;
 a comparator having first and second input terminals respectively coupled to said first and second output terminals of said differential voltage-controlled current source, and first and second output terminals; and
 a differential latch, having first and second input terminals respectively coupled to said first and second output terminals of said comparator, and first and second output terminals for providing said first and second signals of said periodic signal generator.

9. A differential input to single-ended output comparator with a symmetrical output, comprising:
 an input comparator having positive and negative input terminals for respectively receiving first and second input signals of a periodic differential input signal, and positive and negative output terminals;
 a differential latch having first and second input terminals respectively coupled to said positive and negative output terminals of said comparator, and first and second output terminals for respectively providing first and second signals; and
 logic gate having a first input terminal coupled to said first output terminal of said differential latch, a second input terminal coupled to said second output terminal of said differential latch, and an output terminal for providing an output signal of the comparator;
 whereby said output signal of the comparator is symmetrical.

10. The comparator of claim 9 wherein said logic gate comprises:
 a first switching element having a first terminal coupled to a first power supply voltage terminal, a second terminal coupled to an output node providing said output signal of the comparator thereon, and a control terminal for receiving said first signal;
 a second switching element having a first terminal coupled to said first power supply voltage terminal, a second terminal coupled to said output node, and a control terminal for receiving said second signal;

a third switching element having a first terminal coupled to said output node, a second terminal coupled to a second power supply voltage terminal, and first and second control terminals respectively receiving said first and second input signals, said third switching element including first and second switching subelements serially coupled between said output node and said second power supply voltage terminal respectively responsive to said first and second signals; and a fourth switching element having a first terminal coupled to said output node, a second terminal coupled to said second power supply voltage terminal, and first and second control terminals respectively receiving said second and first signals, said fourth switching element including third and fourth switching subelements serially coupled between said output node and said second power supply voltage terminal respectively responsive to said second and first signals.

11. The comparator of claim 10 wherein said first and second switching elements comprise first and second P-channel metal-oxide-semiconductor (MOS) transistors, respectively.

12. The comparator of claim 10 wherein said first, second, third, and fourth switching subelements comprise first, second, third, and fourth N-channel metal-oxide-semiconductor (MOS) transistors, respectively.

* * * * *